(12) United States Patent
Itoh et al.

(10) Patent No.: US 10,076,070 B2
(45) Date of Patent: Sep. 11, 2018

(54) COMPONENT MOUNTING METHOD

(71) Applicant: PANASONIC INTELLECTUAL PROPERTY MANAGEMENT CO., LTD., Osaka (JP)

(72) Inventors: Katsuhiko Itoh, Yamanashi (JP); Masanori Ikeda, Yamanashi (JP); Kenji Okamoto, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 272 days.

(21) Appl. No.: 14/867,241

(22) Filed: Sep. 28, 2015

(65) Prior Publication Data

US 2016/0234983 A1 Aug. 11, 2016

(30) Foreign Application Priority Data

Feb. 10, 2015 (JP) .................................. 2015-023810

(51) Int. Cl.
*H05K 13/04* (2006.01)
*H05K 13/08* (2006.01)
*H05K 3/34* (2006.01)

(52) U.S. Cl.
CPC ......... *H05K 13/0465* (2013.01); *H05K 13/08* (2013.01); *H05K 3/3421* (2013.01); *H05K 3/3478* (2013.01); *H05K 2203/041* (2013.01)

(58) Field of Classification Search
CPC ............... H05K 13/0465; H05K 13/08; H05K 2203/041; H05K 3/3421; H05K 3/3478
See application file for complete search history.

(56) References Cited

U.S. PATENT DOCUMENTS

| | | | |
|---|---|---|---|
| 6,796,481 B2 * | 9/2004 | Yamauchi | H01L 21/563 228/180.1 |
| 2003/0022534 A1 * | 1/2003 | Terada | H01L 24/81 439/71 |
| 2003/0218261 A1 * | 11/2003 | Capote | B23K 35/025 257/787 |
| 2009/0120675 A1 * | 5/2009 | Sakatani | H01L 21/563 174/260 |
| 2010/0229382 A1 * | 9/2010 | Randall | H01G 4/40 29/832 |
| 2016/0234984 A1 * | 8/2016 | Itoh | H05K 13/08 |

FOREIGN PATENT DOCUMENTS

| | | |
|---|---|---|
| JP | 06-275944 A | 9/1994 |
| JP | H07-038246 A | 2/1995 |
| JP | 2008270696 | * 11/2008 |

* cited by examiner

*Primary Examiner* — Minh Trinh
(74) *Attorney, Agent, or Firm* — Pearne & Gordon LLP

(57) ABSTRACT

A component mounting apparatus includes a mounting unit that mounts an electronic component on a board, at least one component supply unit that supplies chip solder, and a control unit that controls the mounting unit to mount the chip solder, which is supplied from the component supply unit, on the board, based on production data in which a size of chip solder to be mounted on each electrode of the board is instructed.

6 Claims, 15 Drawing Sheets

FIG.5

| LIBRARY NAME | AA | 51 |
| --- | --- | --- |
| EXTERNAL SIZE L (mm) | La | 52 |
| EXTERNAL SIZE W (mm) | Wa | 53 |
| NUMBER OF ENTIRE TERMINALS | 6 | 54 |
| TERMINAL NUMBER | IDEAL SOLDER AMOUNT (mm3) | |
| AA-1 | Aa1 | |
| AA-2 | Aa2 | |
| AA-3 | Aa2 | |
| AA-4 | Aa1 | |
| AA-5 | Aa2 | |
| AA-6 | Aa2 | |

| COMPONENT ID | TYPE | X-COORDINATE (mm) | Y-COORDINATE (mm) |
|---|---|---|---|
| AAA | AA | X11 | Y11 |
| BBB | AA | X12 | Y12 |
| CCC | BB | X13 | Y13 |
| DDD | BB | X14 | Y14 |
| ↑ | ↑ | ↑ | ↑ |
| 61 | 62 | 63 | 64 |

FIG.9

| OPENING ID | X-COORDINATE (mm) | Y-COORDINATE (mm) | OPENING SIZE (mm2) | COMPONENT ID |
|---|---|---|---|---|
| A1 | XA1 | YA1 | As1 | AAA |
| A2 | XA2 | YA2 | As2 | AAA |
| A3 | XA3 | YA3 | As3 | AAA |
| A4 | XA4 | YA4 | As4 | AAA |
| A5 | XA5 | YA5 | As5 | AAA |
| A6 | XA6 | YA6 | As6 | AAA |
| B1 | XB1 | YB1 | Bs1 | BBB |
| B2 | XB2 | YB2 | Bs2 | BBB |
| B3 | XB3 | YB3 | Bs3 | BBB |
| B4 | XB4 | YB4 | Bs4 | BBB |
| B5 | XB5 | YB5 | Bs5 | BBB |
| B6 | XB6 | YB6 | Bs6 | BBB |
| C1 | XC1 | YC1 | Cs1 | CCC |
| C2 | XC2 | YC2 | Cs2 | CCC |
| D1 | XD1 | YD1 | Ds1 | DDD |
| D2 | XD2 | YD2 | Ds2 | DDD |
| ↑ | ↑ | ↑ | ↑ | ↑ |
| 71 | 72 | 73 | 74 | 75 |

FIG.13

| COMPONENT ID | TYPE | X-COORDINATE (mm) | Y-COORDINATE (mm) | IDEAL SOLDER AMOUNT (mm3) | THEORETICAL SOLDER AMOUNT (mm3) |
|---|---|---|---|---|---|
| A1 | 0603 | XA1* | YA1* | Aa1 | AA1 |
| A2 | 0402 | XA2* | YA2* | Aa2 | AA2 |
| A3 | 0402 | XA3* | YA3* | Aa2 | AA3 |
| A4 | 0603 | XA4* | YA4* | Aa1 | AA4 |
| A5 | 0402 | XA5* | YA5* | Aa2 | AA5 |
| A6 | 0402 | XA6* | YA6* | Aa2 | AA6 |
| B1 | 0603 | XB1* | YB1* | Aa1 | AB1 |
| B2 | 0402 | XB2* | YB2* | Aa2 | AB2 |
| B3 | 0402 | XB3* | YB3* | Aa2 | AB3 |
| B4 | 0603 | XB4* | YB4* | Aa1 | AB4 |
| B5 | 0402 | XB5* | YB5* | Aa2 | AB5 |
| B6 | 0402 | XB6* | YB6* | Aa2 | AB6 |
|  |  |  |  |  |  |
| AAA | AA | X11 | Y11 | — | — |
| BBB | AA | X12 | Y12 | — | — |
| CCC | BB | X13 | Y13 | — | — |
| DDD | BB | X14 | Y14 | — | — |

↑ 81    ↑ 82    ↑ 83    ↑ 84    ↑ 85    ↑ 86

COMPONENT MOUNTING METHOD

CROSS-REFERENCES TO RELATED APPLICATION(S)

This application is based on and claims priority from Japanese Patent Application No. 2015-23810 filed on Feb. 10, 2015, the entire contents of which are incorporated herein by reference.

BACKGROUND

1. Field of the Invention

The present invention relates to a component mounting apparatus that mounts a component on a board, a component mounting method, and a component mounting line.

2. Description of Related Art

In the manufacture of a mounting board in which an electronic component (hereinafter, referred to as a "component") is mounted on a board, a solder printer transfers cream solder to a component bonding electrode (hereinafter, referred to as a "land") of the board through a metal mask, a component mounting apparatus mounts the component on the board, and then, the cream solder is melted through reflow such that a component terminal is bonded to the land. In recent years, an opening area of the metal mask has become smaller according to miniaturization of the component and pitches between the component terminals have become narrower and thus, a thin metal mask is used in order to cope with a printing defect due to deterioration in spreading of the solder.

Meanwhile, cream solder which is only supplied to the land through the thin metal mask is insufficient as a solder amount required to bond a component terminal of a large-sized component to the land. Thus, there has been proposed a method in which a chip-shaped solder (hereinafter, referred to as "chip solder") is mounted on a land in which the solder amount is insufficient to supplement the insufficient solder amount (for example, see JP-A-6-275944 as Patent Document 1). In a method disclosed in JP-A-6-275944, a plurality of types of chip solder having the same size as a component are prepared and any one type of chip solder is mounted on a board at the same time that the component is mounted.

Patent Document 1: JP-A-6-275944

SUMMARY

However, in technologies of the related art including JP-A-6-275944, when chip solder is mounted on a board in a component mounting apparatus, a specific method of designating an appropriate size of chip solder to be mounted is not disclosed. Hence, there are problems in that it is difficult to designate and to mount pieces of chip solder having appropriate sizes a vast multitude of lands on the board, respectively.

A non-limited object of one or more aspects of the present invention is to provide a component mounting apparatus, a component mounting method, and a component mounting line, in which it is possible to mount chip solder having an appropriate size on a board.

A component mounting apparatus according to an aspect of the present invention includes: a mounting unit that mounts an electronic component on a board; at least one component supply unit that supplies chip solder; and a control unit that controls the mounting unit to mount the chip solder, which is supplied from the component supply unit, on the board, based on production data in which a size of chip solder to be mounted on each electrode of the board is instructed.

A component mounting method according to an aspect of the present invention includes: mounting chip solder supplied from a component supply unit, on a board, by a mounting unit, based on production data in which a size of the chip solder to be mounted on each electrode of the board is instructed; and mounting an electronic component on the board on which the chip solder is mounted.

A component mounting line according to an aspect of the present invention includes: a solder printer that prints on a board with cream solder; and a component mounting apparatus that includes: a mounting unit that mounts an electronic component on the board; at least one component supply unit that supplies chip solder; and a control unit that controls the mounting unit to mount the chip solder, which is supplied from the component supply unit, on the board, based on production data in which a size of chip solder to be mounted on each electrode of the board is instructed.

According to the aspects of the present invention, it may be possible to mount chip solder having an appropriate size on a board.

BRIEF DESCRIPTION OF THE DRAWINGS

FIG. 5 is an explanatory table illustrating a configuration of component data in the component mounting line according to the embodiment of the present invention.

FIG. 7 is an explanatory table illustrating a configuration of mounting position data in the component mounting line according to the embodiment of the present invention.

FIG. 9 is an explanatory table illustrating a configuration of mask data in the component mounting line according to the embodiment of the present invention.

FIG. 13 is an explanatory table illustrating a configuration of production data in the component mounting line according to the embodiment of the present invention.

DETAILED DESCRIPTION

Next, an embodiment of the present invention will be described with reference to the accompanying drawings. Hereinafter, a board transport direction (rightward/leftward direction on the paper surface in FIG. 2) is defined as an X direction, and a direction (upward/downward direction on the paper surface in FIG. 2) orthogonal to the X direction in a horizontal plane is defined as a Y direction.

Figure 1:
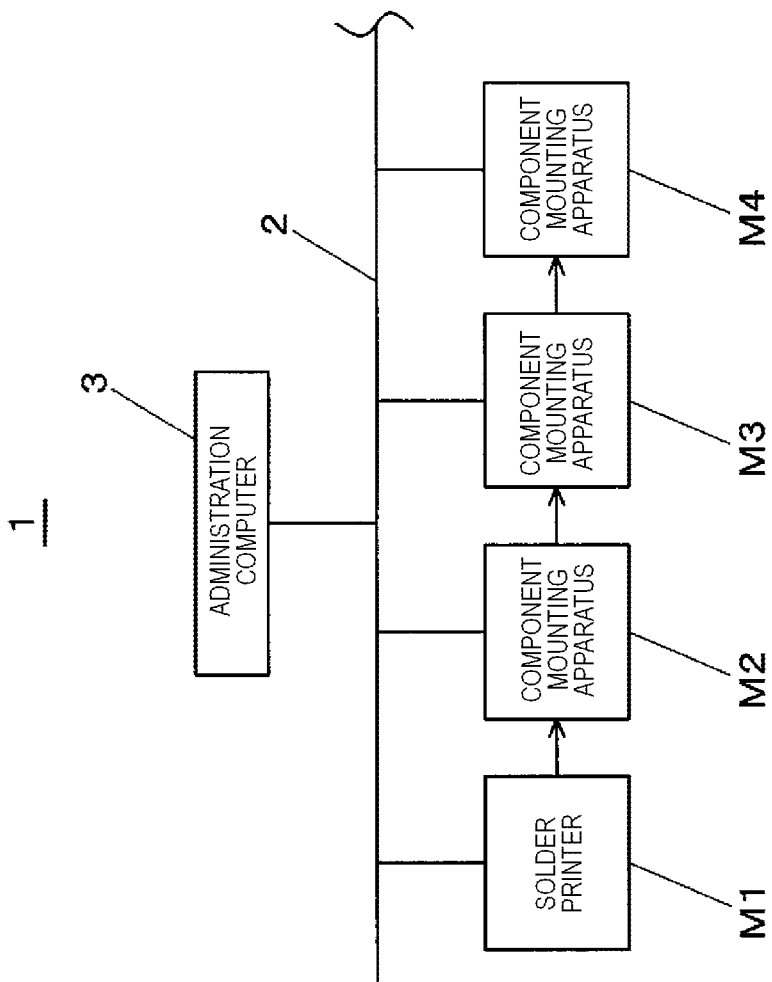
FIG. 1 is a block diagram illustrating a configuration of a component mounting line according to an embodiment of the present invention.

First, a component mounting line 1 will be described with reference to FIG. 1. The component mounting line 1 in FIG. 1 has a function of manufacturing a mounting board by mounting a component on a board. The component mounting line 1 is configured to connect respective apparatuses of a solder printer M1 and component mounting apparatuses M2 to M4 as a plurality of component mounting apparatuses, to connect the respective apparatuses through a communication network 2, and to control all the apparatuses by an administration computer 3.

The solder printer M1 has a function of transferring paste-like cream solder to a land formed on a board, through a metal mask, using screen printing. The component mounting apparatuses M2 to M4 have functions of, by a mounting head, picking up a component from a component supply unit and of carrying and mounting the component at a mounting position of the board, to which the cream solder is transferred. The board is subjected to a reflow process after the component is mounted thereon, the cream solder is melted such that a component terminal of the component mounted on the board is bonded by solder to the land of the board, and thereby the mounting board is manufactured. In this manner, the component mounting line 1 includes the solder printer M1 that performs printing on the board with the cream solder and the component mounting apparatuses M2 to M4 that mount the component (electronic component) on the board.

Figure 2:
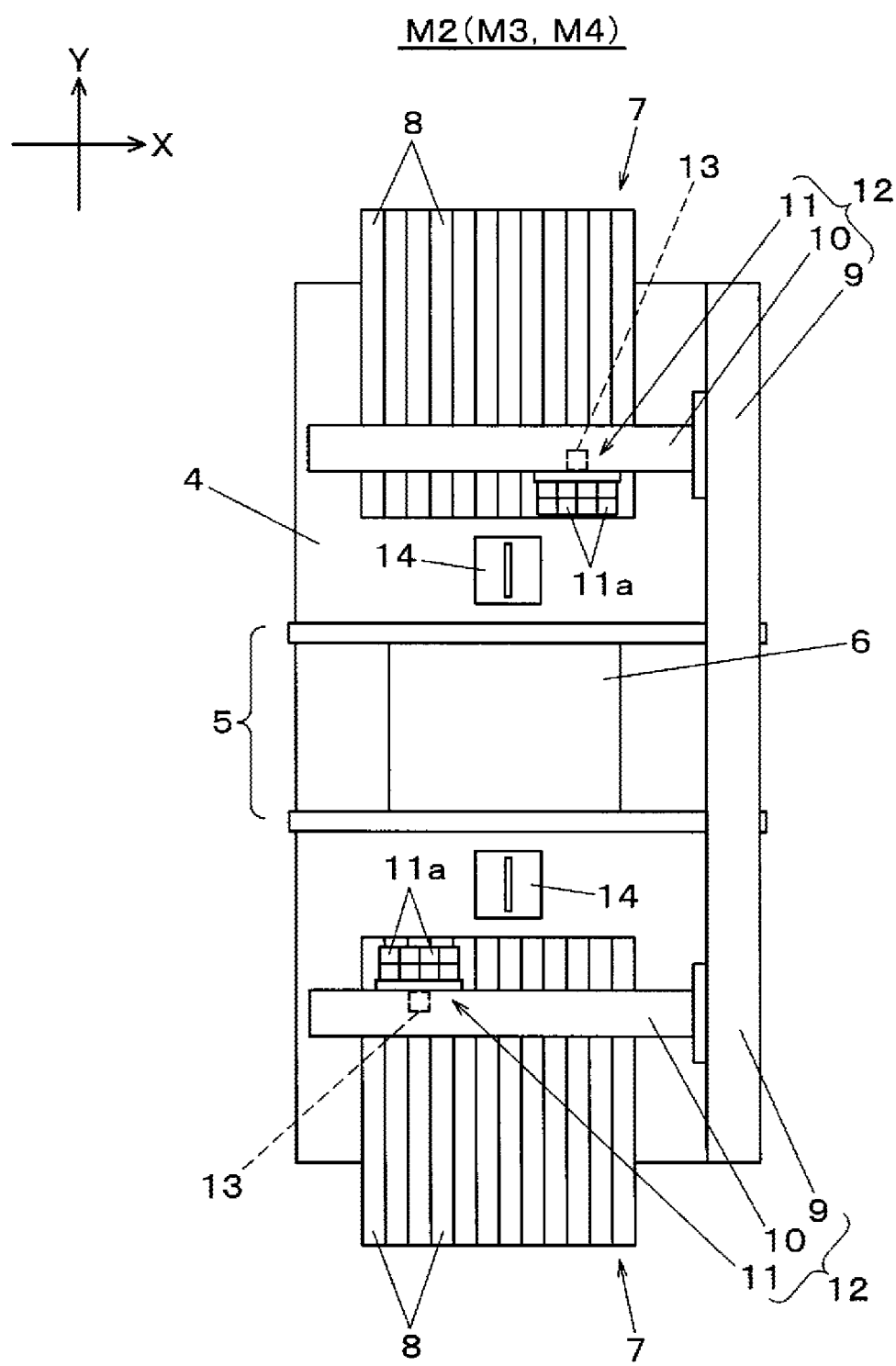
FIG. 2 is a plan view illustrating a configuration of a component mounting apparatus according to the embodiment of the present invention.

Next, the component mounting apparatuses M2 to M4 will be described with reference to FIG. 2. Since the component mounting apparatuses M2 to M4 have the same structure, here, only the component mounting apparatus M2 will be described. In FIG. 2, a board transport unit 5 is disposed in the X direction at the center of a base 4. The board transport unit 5 has functions of transporting a board 6 which is transported in from the upstream side and which becomes a target of a component mounting operation and of positioning and holding the board 6 at a mounting operation position at which a mounting unit to be described below performs the component mounting operation.

Component supply units 7 that supply the component as a mounting target are disposed on both outer side of the board transport unit 5 in Y direction. A plurality of tape feeders 8 is disposed in parallel in the component supply unit 7. The tape feeders 8 have a function of feeding a component D or chip solder CS (refer to FIG. 3) held in a carrier tape to a picking-up position by the mounting unit. That is, the component mounting apparatuses M2 to M4 include the plurality of tape feeders 8 that corresponds to component supply means such that it is possible to supply pieces of the chip solder CS having different sizes and further, include another tape feeder 8 that supplies the component D (electronic component).

A Y-axis traveling table 9 is disposed on one end portion of the top surface of the base 4 in the X direction. Two X-axis traveling tables 10 are slidably joined to the Y-axis traveling table 9 in the Y direction. Mounting heads 11 are slidably mounted in the X-axis traveling tables 10, respectively, in the X direction. The Y-axis traveling table 9 and the X-axis traveling table 10 configure a head traveling mechanism that causes the mounting head 11 to travel in a horizontal surface. Driving of the head traveling mechanism allows the mounting heads 11 to travel between the component supply unit 7 and the board 6 positioned and held at the mounting operation position by the board transport unit 5.

The mounting head 11 is a multi-type head formed of a plurality of unit holding heads 11a. A suction nozzle is mounted on a lower end portion of the unit holding head 11a such that the component D or the chip solder CS fed to the picking-up position of the tape feeder 8 is subjected vacuum suction and held, and is mounted at a predetermined mounting position on the board 6 positioned and held at the mounting operation position. In this manner, the head traveling mechanism and the mounting head 11 configure a mounting unit 12 that mounts the component D (electronic component) or the chip solder CS on the board 6.

Board-recognition cameras 13 that integrally travel to the mounting heads 11, respectively, are mounted on the under surface of the respective X-axis traveling tables 10. The driving of the head traveling mechanism allows the board-recognition cameras 13 to travel above the board 6 positioned and held by the board transport unit 5 and thereby, the board-recognition cameras 13 image the board 6 from above. A component-recognition camera 14 is disposed between the component supply unit 7 and the board transport unit 5. The mounting head 11 that has picked up the component D or the chip solder CS from the component supply unit 7 performs a scanning operation of passing above the component-recognition camera 14 in a predetermined direction and thereby, the component-recognition camera 14 images the component D or the chip solder CS which is in a state of being held by the mounting head 11.

Next, the board 6 and the component D and the chip solder CS which are mounted on the board 6 by the component mounting line 1 will be described with reference to FIG. 3. The board 6 in FIG. 3 has a structure in which a wiring layer 6b (circuit pattern) formed on a surface of an insulation board 6a which corresponds to a base is covered with a solder resist 6c having insulation properties. In the solder resist 6c, a solder resist opening 6d is formed at a position at which the circuit pattern formed in the board 6 is bonded to a component terminal T of the component D and an electrode (land E) through which the wiring layer 6b is exposed to the surface of the board 6 is formed.

Figure 3:
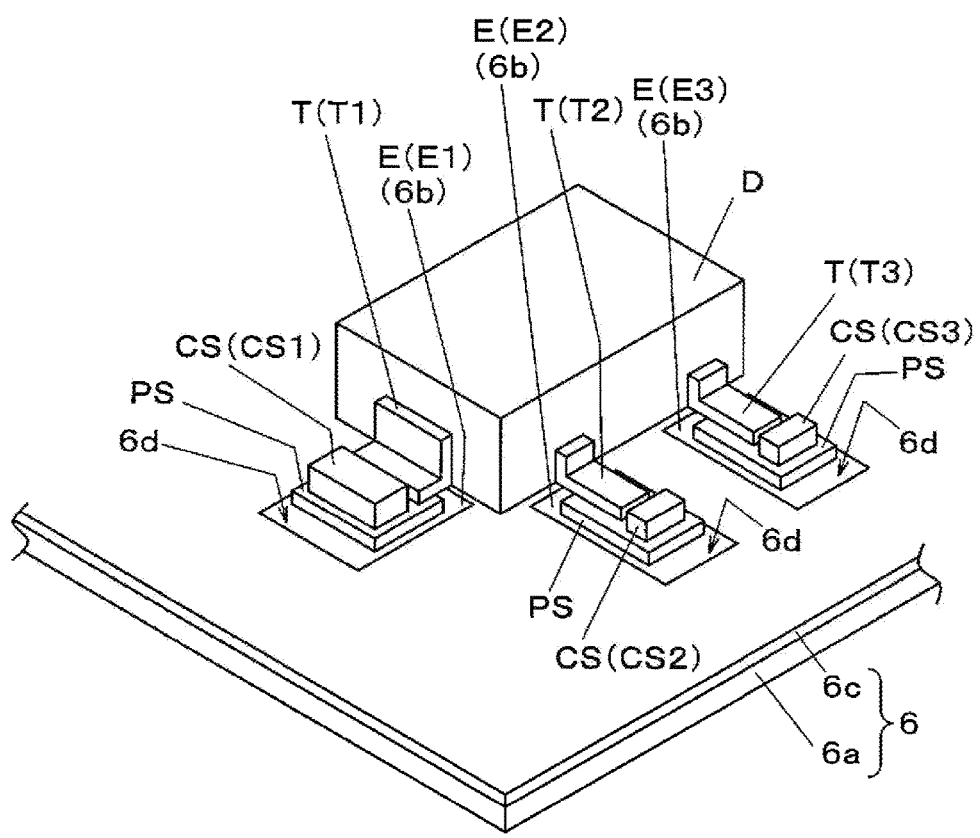
FIG. 3 is an explanatory perspective view illustrating components and pieces of chip solder mounted on a board by the component mounting line according to the embodiment of the present invention.

In FIG. 3, the solder printer M1 transfers paste solder PS above respective lands E (E1 to E3). The component D is mounted at a predetermined mounting position by the component mounting apparatuses M2 to M4 such that respective component terminals T (T1 to T3) come into contact with the predetermined lands E (E1 to E3) through the paste solder PS. Pieces of chip solder CS (CS1 to CS3) are mounted on the respective lands E (E1 to E3) and are used to supplement an insufficient solder amount only when the transferred paste solder PS is not sufficient. In an example of FIG. 3, the large piece of chip solder CS1 is mounted on the land E1 which is bonded to the large component terminal T1 and the small pieces of chip solder CS2 and CS3 are mounted on the lands E2 and E3 which are bonded to the small component terminals T2 and T3, respectively.

Figure 4:
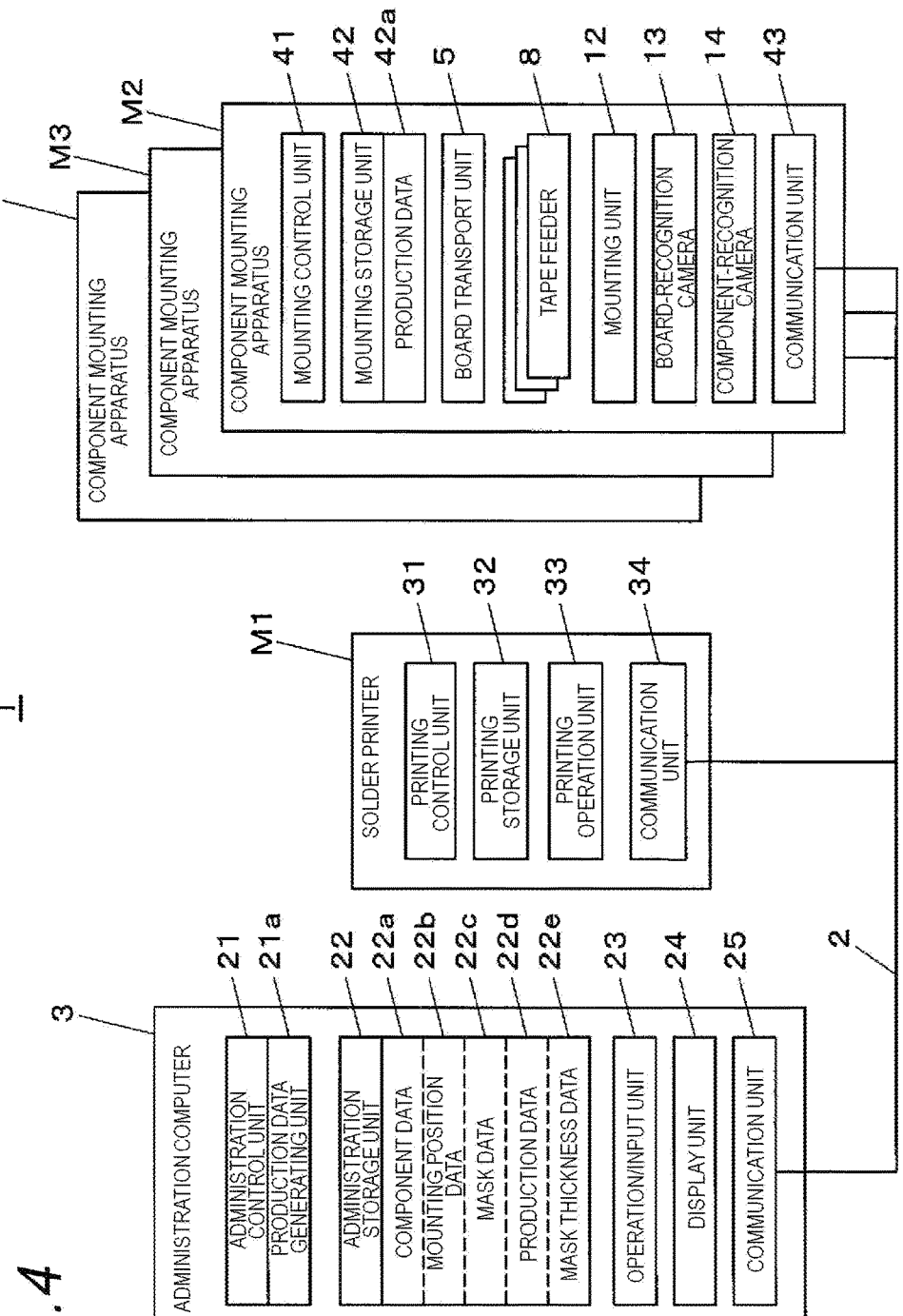
FIG. 4 is a block diagram illustrating a configuration of a control system of the component mounting line according to the embodiment of the present invention.
Figure 6:
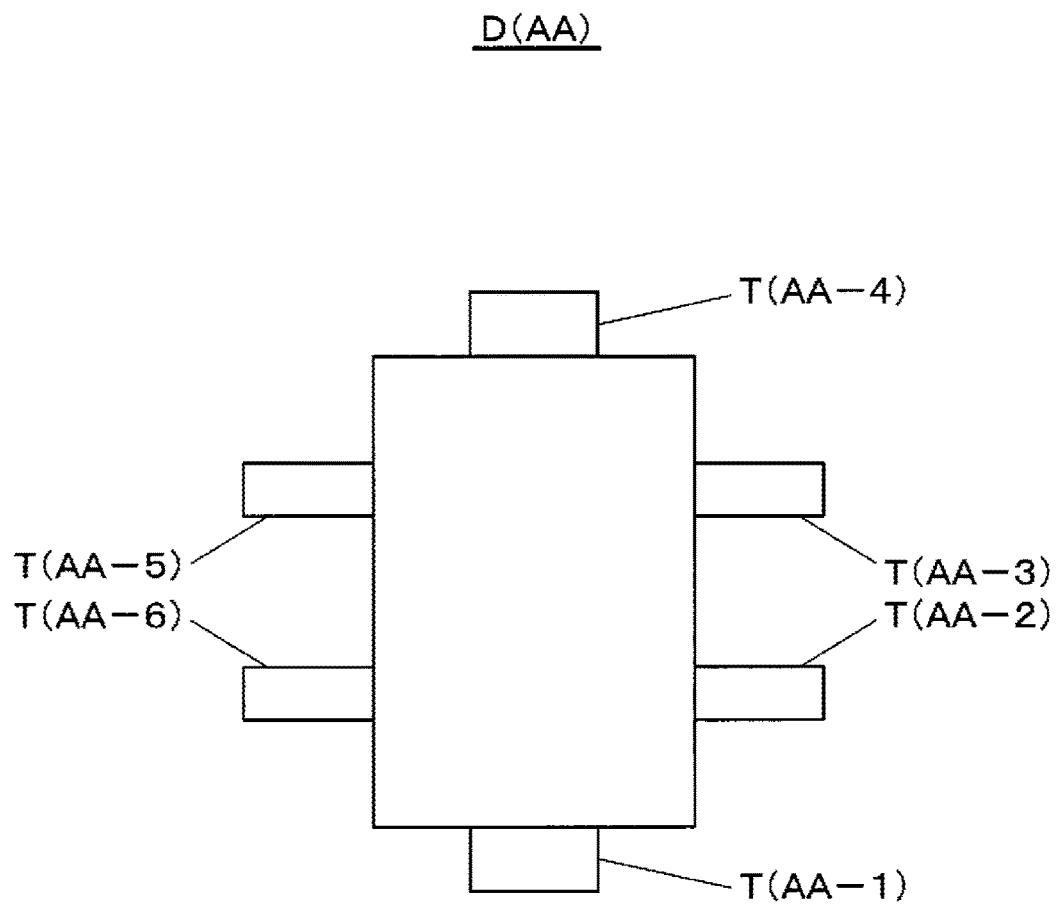
FIG. 6 is an explanatory view illustrating an example of the component which is mounted on the board by the component mounting line according to the embodiment of the present invention.

Next, a configuration of a control system of the component mounting line 1 will be described with reference to FIG. 4. In FIG. 4, an administration computer 3 includes an administration control unit 21, an administration storage unit 22, operation/input unit 23, and a display unit 24 and is connected to the communication network 2 through a communication unit 25. The administration control unit 21 has a function of performing overall control in the respective apparatuses which configure the component mounting line 1. Further, the administration control unit 21 includes a production data generating unit 21a. The production data generating unit 21a computes various types of data stored in the administration storage unit 22 to be described below and performs a production data generating operation of generating production data which is referred to in the mounting operation of the component D and the chip solder CS in the component mounting apparatuses M2 to M4.

The administration storage unit 22 stores component data 22a, mounting position data 22b, mask data 22c, production data 22d, mask thickness data 22e, and the like, in addition to production administrating data with which an operation to be executed by the component mounting line 1 is administrated. The component data 22a means data of a shape or the like of the component D which is mounted on the board 6. The mounting position data 22b means data of a type of the component D which is mounted on the board 6, an X- or Y-coordinate, or the like of a mounting position. The mask data 22c means data of an X- or Y-coordinate, an opening size, or the like of a mask opening of the metal mask.

The production data 22d means data which is generated by the production data generating unit 21a and is referred to in the mounting operation in the component mounting apparatuses M2 to M4. The production data 22d is transmitted to the component mounting apparatuses M2 to M4 through the communication unit 25 and the communication network 2 and is stored in mounting storage units of the component mounting apparatuses M2 to M4. The mask thickness data 22e means data of a mask thickness which is the thickness of the metal mask. The various types of data will be described below in detail.

The operation/input unit 23 corresponds to an input device such as a keyboard or a touch panel provided on a display screen of the display unit 24 and performs an operation to instruct an operation or to input data. The display unit 24 corresponds to a display device such as a liquid crystal panel and displays an input screen of the various types of data or the like.

The solder printer M1 in FIG. 4 includes a printing control unit 31, a printing storage unit 32, and a printing operation unit 33 and is connected to the communication network 2 through a communication unit 34. The printing control unit 31 controls the printing operation unit 33 based on various programs or types of data stored in the printing storage unit 32 and thereby, screen printing is performed on the board 6 with the cream solder PS through the metal mask.

Each of the component mounting apparatuses M2 to M4 in FIG. 4 includes a mounting control unit 41, a mounting storage unit 42, the board transport unit 5, the plurality of tape feeders 8, the mounting unit 12, the board-recognition camera 13, and the component-recognition camera 14 and is connected to the communication network 2 through a communication unit 43. The mounting control unit 41 corresponds to a computing device and controls respective units to be described below, based on various programs or types of data stored in the mounting storage unit 42. The mounting storage unit 42 stores the production data 22d transmitted from the administration computer 3 as production data 42a. The production data 42a means data which is used to mount the component D and the chip solder CS on the board 6.

The board transport unit 5 is controlled by the mounting control unit 41, transports the board 6, and positions and holds the board 6 at the mounting operation position. The tape feeder 8 is controlled by the mounting control unit 41 and supplies the component D or the chip solder CS to the picking-up position. The mounting unit 12 is controlled by the mounting control unit 41 and carries and mounts the component D or the chip solder CS supplied to the picking-up position, to the predetermined mounting position of the positioned and held board 6. In addition, the mounting control unit 41 performs a recognition process of an imaging result by the board-recognition camera 13 and the component-recognition camera 14 and performs correction of the mounting position of the component D or the chip solder CS based on the recognition result.

Next, various types of data which are stored in the administration storage unit 22 will be described in detail with reference to FIGS. 5 to 10. First, the component data 22a will be described with reference to FIGS. 5 and 6. FIG. 5 illustrates a configuration of the component data 22a of the component D (AA) illustrated in FIG. 6. Terminal numbers (AA-1 to AA-6) are attached to the component terminals T of the component D (AA), respectively. In the component data 22a, A type (AA) of the component D is recorded in a "library name" row 51, an external size L (La) of the component D is recorded in an "external size L" row 52, an external size W (Wa) of the component D is recorded in an "external size W" row 53, and the number (6) of the component terminals T is recorded in an "entire terminal number" row 54.

In the component data 22a, corresponding to the terminal numbers (AA-1 to AA-6) of a "terminal number" column 55, in a case where the land E bonded to the component terminal T has a standard shape which is recommended in a data sheet or the like, an ideal solder amount VI (Aa1 and Aa2) which means the ideal solder amount required to form appropriate solder bonding is recorded in an "ideal solder amount" column 56. In this example, the same ideal solder amount VI is designated to the component terminals T having the same shape.

Figure 8:
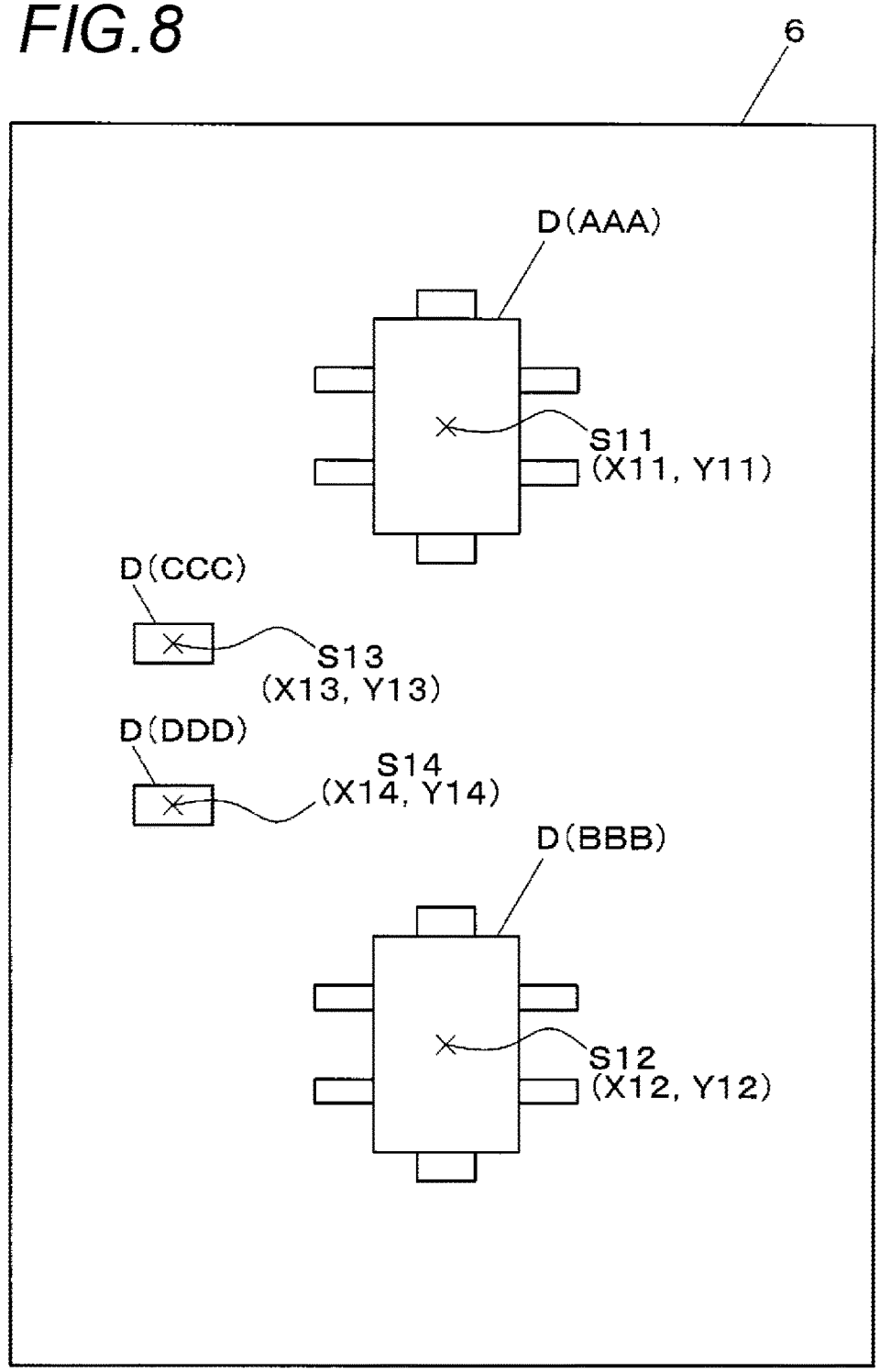
FIG. 8 is an explanatory view illustrating an example of the board on which the components are mounted by the component mounting line according to the embodiment of the present invention.

Next, the mounting position data 22b will be described with reference to FIGS. 7 and 8. FIG. 7 illustrates a configuration of the mounting position data 22b of the board 6 on which four components D illustrated in FIG. 8 are mounted. Component numbers (AAA, BBB, CCC, and DDD) are attached to the respective components D. In the mounting position data 22b, corresponding to the component numbers (AAA, BBB, CCC, and DDD) of a "component ID" column 61, types (AA, BB, CC, and DD) of the component D are recorded in a "type" column 62 and X-coordinates (X11 to X14) and Y-coordinates (Y11 to Y14) of mounting positions S (S11 to S14) of the component D on the board 6 are recorded in an "X-coordinate" column 63 and a "Y-coordinate" column 64, respectively. The types of the component D of the "type" column 62 are associated with the types of the component D in the "library name" row 51 of the component data 22a illustrated in FIG. 5.

Figure 10:
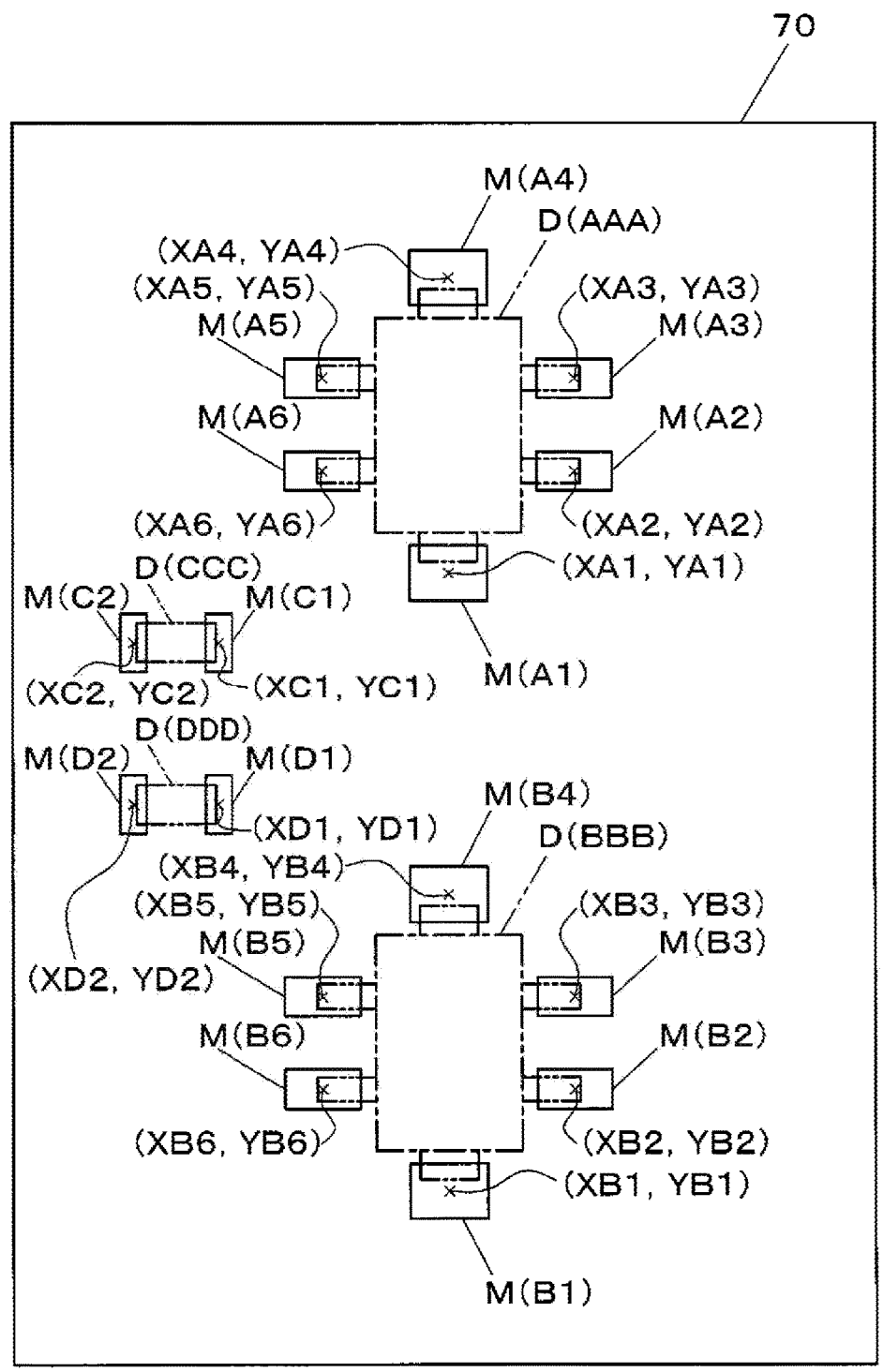
FIG. 10 is an explanatory view illustrating an example of a mask opening of a mask which is used in the component mounting line according to the embodiment of the present invention.

Next, the mask data 22c will be described with reference to FIGS. 9 and 10. FIG. 9 illustrates a configuration of the mask data 22c of a metal mask 70 used in a printing operation in FIG. 10. In the metal mask 70 in FIG. 10, a mask opening M is formed at positions of the lands E which are bonded to the component terminals T of the four components D (AAA, BBB, CCC, and DDD) which are mounted on the board 6. In the printing operation, the cream solder PS is transferred to the land E through the mask opening M. Opening numbers (A1 to A6, B1 to B6, C1 and C2, and D1 and D2) are assigned to the respective mask openings M.

In the mask data 22c, corresponding to the opening numbers (A1 to A6, B1 to B6, C1 and C2, and D1 and D2) of an "opening ID" column 71, X-coordinates (XA1 to XA6, XB1 to XB6, XC1 and XC2, and XD1 and XD2) and Y-coordinates (YA1 to YA6, YB1 to YB6, YC1 and YC2, and YD1 and YD2) of the mask openings M are recorded in an "X-coordinate" column 72 and a "Y-coordinate" column 73, respectively. In addition, mask opening sizes (As1 to As6, Bs1 to Bs6, Cs1 and Cs2, and Ds1 and Ds2) are recorded in an "opening size" column 74 and component numbers (AAA, BBB, CCC, and DDD) of the component D corresponding to the mask openings M are recorded in a "component ID" column 75. The component numbers of the "component ID" column 75 are associated with the component numbers of the "component ID" column 61 of the mounting position data 22b illustrated in FIG. 7.

Next, a size of the chip solder CS which is mounted on the land E will be described with reference to FIG. 11. The ideal solder amount VI required for forming appropriate solder bonding between the land E and the component terminal T depends on a shape of the component terminal T, a shape of the land E, or the like, which are bonded. When a solder amount of the cream solder PS which is supplied to each of the lands E through the printing operation is insufficient for the ideal solder amount VI, a defect can be generated in that appropriate solder bonding is not formed. In order to prevent such a solder defect, the insufficient solder amount by the cream solder PS which is supplied through the printing operation is supplemented by mounting the chip solder CS on the land E.

The theoretical solder amount (theoretical solder amount VT) of the cream solder PS which is supplied to each of the lands E through the printing operation is calculated using a mask opening size MS and the mask thickness H of the metal mask 70. FIG. 11 illustrates a graph in which the X axis represents a difference VD of the ideal solder amount VI by the theoretical solder amount VT (ideal solder amount VI-theoretical solder amount VT) and the Y axis represents an additional solder amount VA. The ideally additional solder amount VA is equal to the difference VD. That is, a relationship between the ideally additional solder amount VA and the difference VD is represented by a straight line having a slope of 1 (straight line a in FIG. 11).

Figure 11:
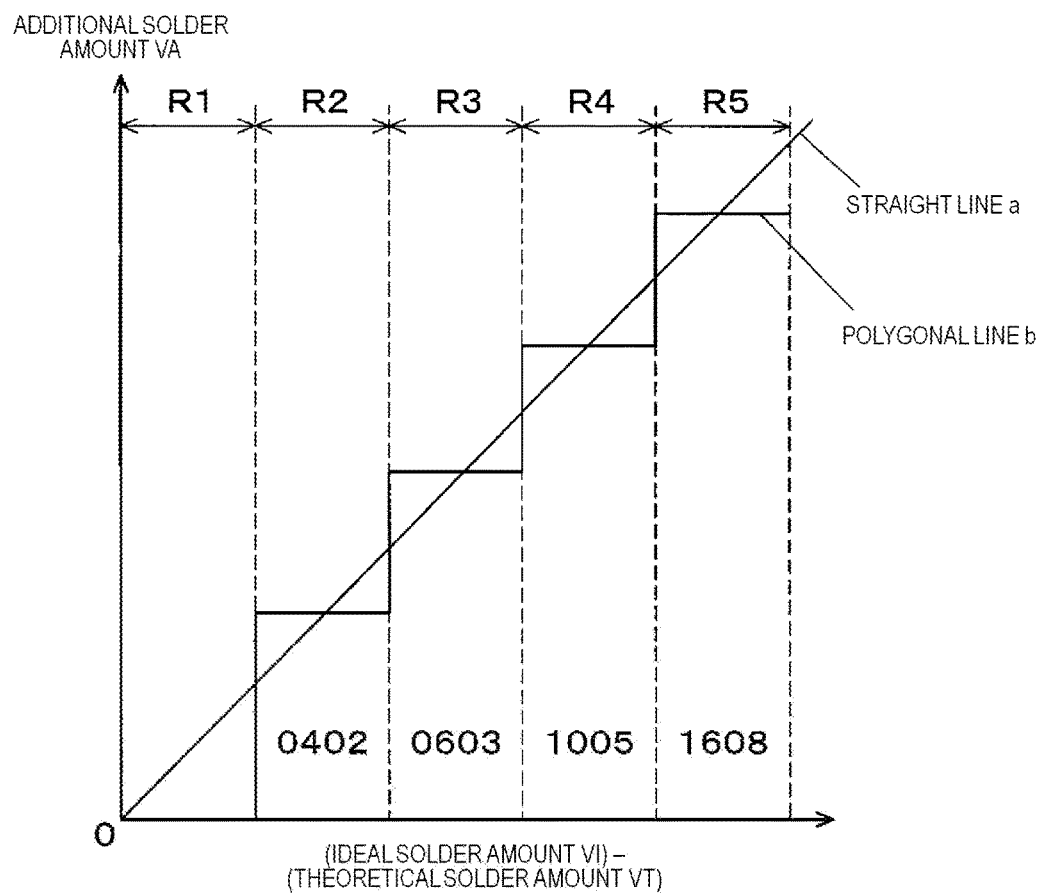
FIG. 11 is an explanatory graph illustrating a relationship between a size of the chip solder and an ideal solder amount and a theoretical solder amount in the component mounting line according to the embodiment of the present invention.

Meanwhile, in a case where the additional solder is supplied by the chip solder CS, a relationship between the additional solder amount VA by the chip solder CS and the difference VD is shown in a stepwise shape (polygonal line b in FIG. 11). In an example in FIG. 11, the chip solder CS which is added has four types (in ascending order, 0402, 0603, 1005, and 1608) of sizes and the difference VD is divided into five regions R (R1 to R5). The regions R (R1 to R5) are set to have as small a difference as possible (difference between the straight line a and the polygonal line b in FIG. 11) between the solder amount of the chip solder CS which is added and the ideal additional solder amount VA.

The types of chip solder CS which is mounted on the respective lands E are determined in accordance with a relationship between the regions R (R1 to R5) and the sizes of the chip solder CS. That is, in the region R1 having the smallest difference VD, the chip solder CS is not additionally mounted. In the region R2 having the second-smallest difference VD, the smallest chip solder CS of 0402 is selected. Similarly, in the region R3, 0603 is selected, in the region R4, 1005 is selected, and in the region R5, 1608 is selected.

Figure 12:
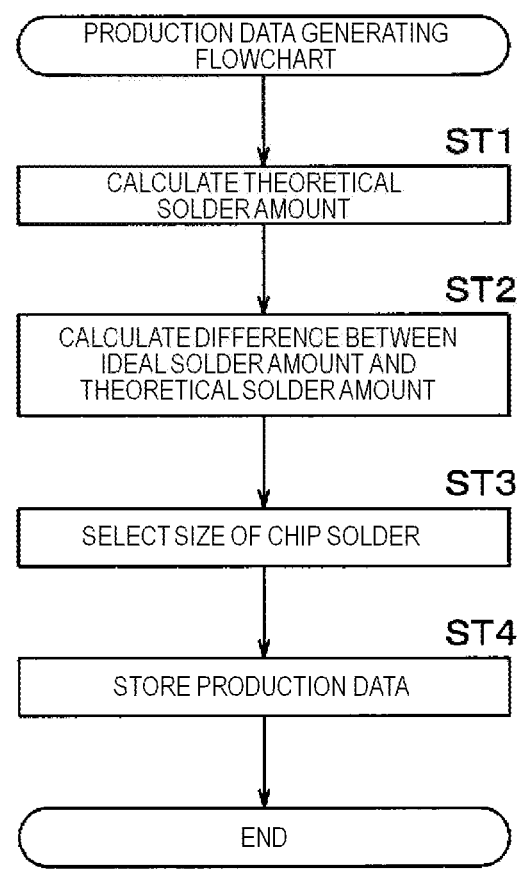
FIG. 12 is a flowchart illustrating a production data generating operation in the component mounting line according to the embodiment of the present invention.

Next, the production data generating operation (production data generating method) of generating the production data 22d and a configuration of the generated production data 22d will be described with reference to FIGS. 12 to 14. In FIG. 12, first, the production data generating unit 21a calculates the theoretical solder amount VT that means a volume of the paste solder PS which is transferred for each mask opening M, from the mask opening size MS recorded in the mask data 22c and the mask thickness H recorded in the mask thickness data 22e (ST1: theoretical solder amount calculating step).

Next, the production data generating unit 21a causes the ideal solder amount VI of the component data 22a to be associated with the mask data 22c by the mounting position data 22b and calculates the difference VD (ST2: difference calculating step) between the ideal solder amount VI associated for each mask opening M and the theoretical solder amount VT calculated in the "theoretical solder amount calculating step" (ST1). Next, the production data generating unit 21a selects a type of chip solder CS which is to be mounted on the land E (ST3: size selecting step) in response to the difference VD calculated in the "difference calculating step" (ST2) according to a relationship between the region R of the difference VD described above and the size (type) of chip solder CS.

Next, the production data generating unit 21a generates the production data 22d in which the type and mounting position S of chip solder CS which is mounted on the board 6, the ideal solder amount VI, the theoretical solder amount VT, and the type and mounting position S of the component D are instructed, stores the production data 22d in the administration storage unit 22, transmits the production data 22d to the component mounting apparatuses M2 to M4 (ST4: production data storing step), and the production data generating operation is ended.

In the "production data storing step" (ST4), the production data generating unit 21a generates the production data 22d as follows. That is, the production data generating unit 21a records results of association with the opening numbers of the "opening ID" column 71 of the mask data 22c in a "component ID" column 81 and records the type (size) of chip solder CS selected in the "size selecting step" (ST3) in a "type" column 82.

The production data generating unit 21a causes the X-coordinates of the "X-coordinate" column 72 of the mask data 22c and the Y-coordinates of the "Y-coordinate" column 73 of the mask data 22c to be shifted according to the shape of the component D and records the shift results in an "X-coordinate" column 83 and in a "Y-coordinate" column 84, respectively. In addition, the production data generating unit 21a records the ideal solder amount VI associated in the "difference calculating step" (ST2) in an "ideal solder amount" column 85 and records the theoretical solder amount VT calculated in the "theoretical solder amount calculating step" (ST1) in a "theoretical solder amount" column 86. In the production data 22d, the size of the chip solder CS which is mounted on each land E (electrode) of the board 6 is instructed.

Further, the production data generating unit 21a records results of association with the component numbers of the "component ID" column 61 of the mounting position data 22b in the "component ID" column 81 and records the type of component D of the "type" column 62 of the mounting position data 22b in the "type" column 82. In addition, the production data generating unit 21a records the X-coordinates of the "X-coordinate" column 63 of the mounting position data 22b in the "X-coordinate" column 83 and records the Y-coordinates of the "Y-coordinate" column 64 of the mounting position data 22b in the "Y-coordinate" column 84.

As described above, in the production data 22d, the ideal solder amount VI which means the ideal solder amount with which the component D (electronic component) is mounted and the theoretical solder amount VT which means the theoretical solder amount of cream solder PS which is theoretically used to perform printing by the solder printer M1 are instructed. The size of the chip solder CS in the production data 22d is determined based on the ideal solder amount VI and the theoretical solder amount VT. Accordingly, it is possible to select pieces of the chip solder CS having appropriate sizes which are to be mounted on the respective lands E.

Figure 14:
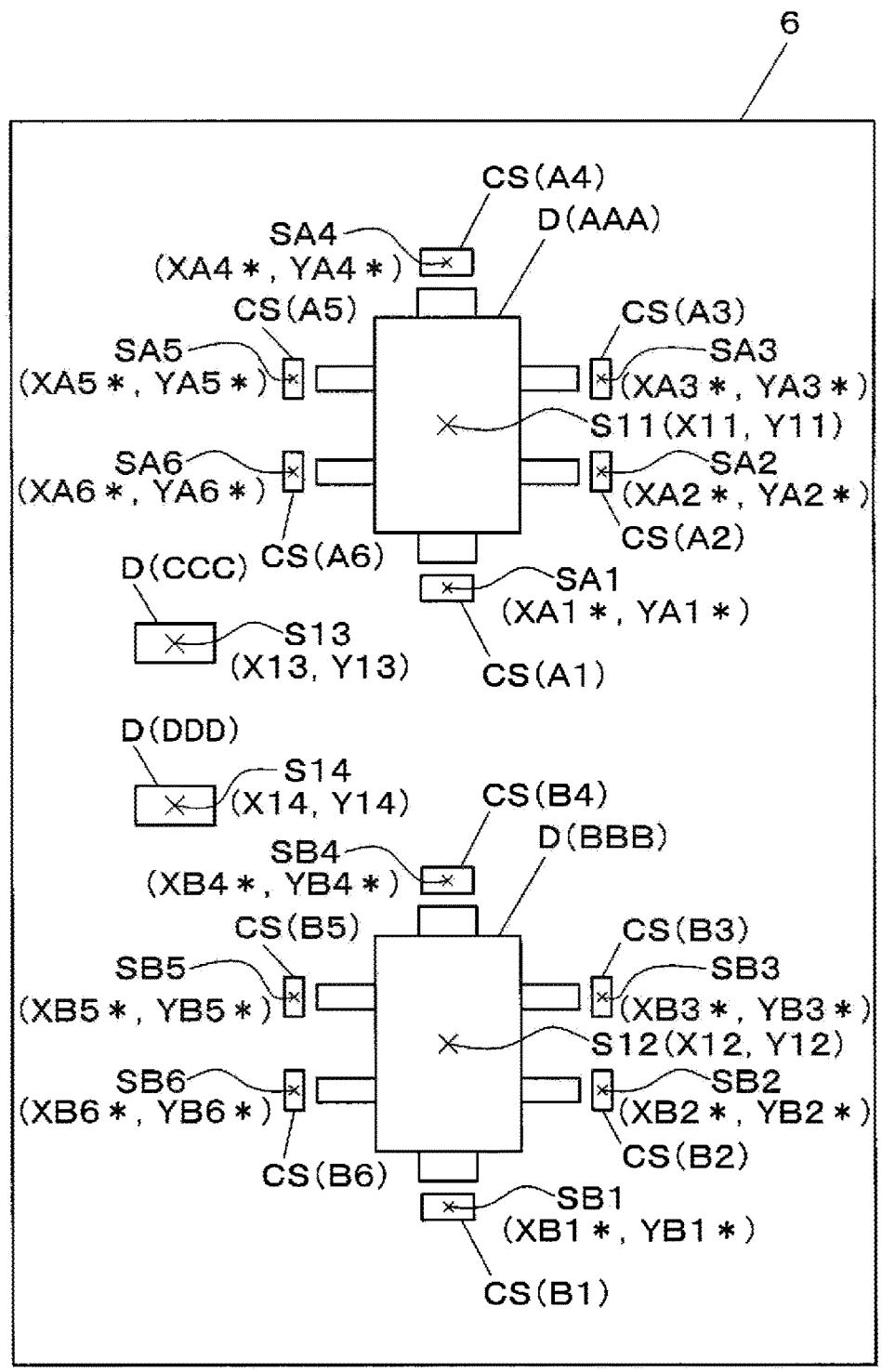
FIG. 14 is an explanatory view illustrating an example of the board on which the components and the pieces of chip solder are mounted by the component mounting line according to the embodiment of the present invention.

In FIGS. 13 and 14, the X- and Y-coordinates of the mounting position S (SA1 to SA6 and SB1 to SB6) of the chip solder CS, which are shifted from the X- and Y-coordinates of the mask openings M by the production data generating unit 21a is shown as X-coordinates (XA1* to XA6* and XB1* to XB6*) and Y-coordinates (YA1* to YA6* and YB1* to YB6*). In addition, in this example, since the difference VD of the lands E of the small component D (CCC) and the component D (DDD) is included in the region R1, the chip solder CS is not mounted on the land E.

Figure 15:
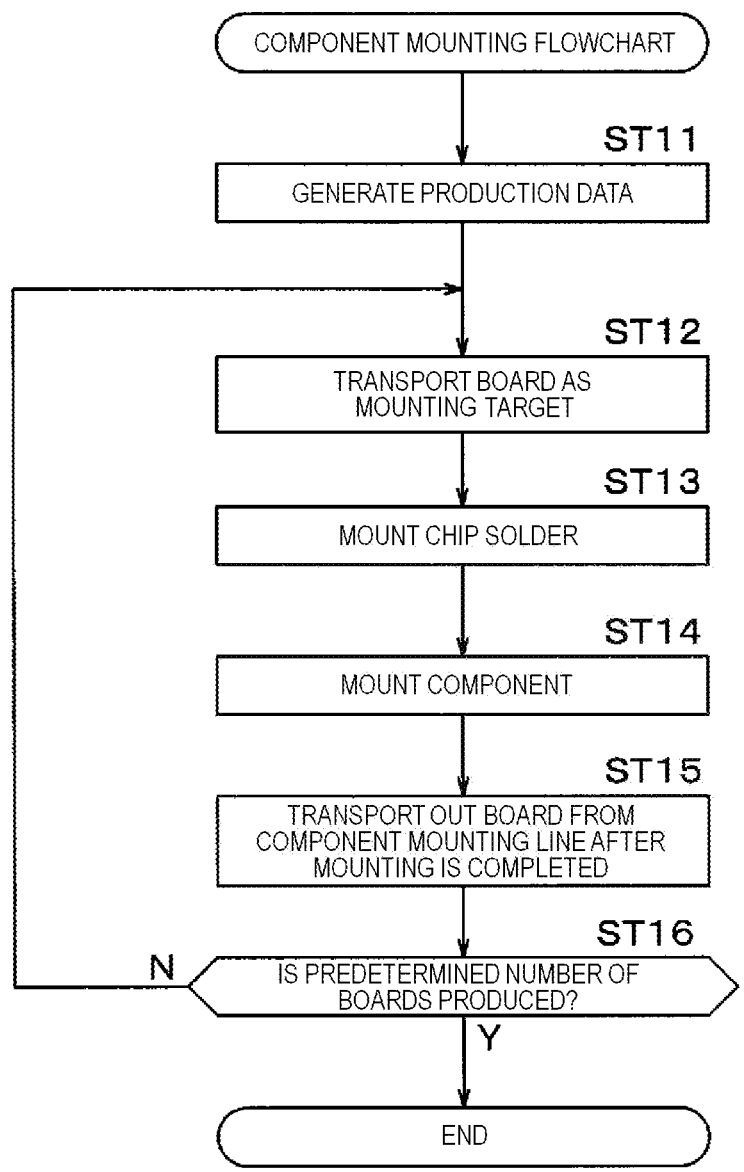
FIG. 15 is a flowchart illustrating a component mounting operation in the component mounting line according to the embodiment of the present invention.

The component mounting operation (component mounting method) in the component mounting line 1 of the present embodiment will be described with reference to FIG. 15. First, the production data generating unit 21a of the administration computer 3 executes the production data generating operation described above such that the production data 22d is generated. The mounting control units 41 of the component mounting apparatuses M2 to M4 receive the production data 22d and stores the production data 22d as the production data 42a in the mounting storage unit 42 (ST11: production data generating step). Next, the mounting control unit 41 controls the board transport unit 5, transports the board 6 to the mounting operation position and positions and holds the board 6 on which the screen printing is performed with the cream solder PS in the solder printer M1 which is a target of the component mounting operation (ST12).

Next, the mounting control unit 41 controls the mounting unit 12 and the tape feeder 8 based on the production data 42a and mounts the chip solder CS having the predetermined size on the board 6 (ST13: chip solder mounting step). That is, in the "chip solder mounting step" (ST13), the mounting control unit 41 (control unit) performs control such that the mounting unit 12 mounts the chip solder CS which is supplied from the tape feeder 8 (component supply means), on the board 6, based on the production data 42a in which the size of the chip solder CS which is mounted on each land E (electrode) of the board 6 is instructed.

Next, the mounting control unit 41 controls the mounting unit 12 and the tape feeder 8 based on the production data 42a and mounts the component D (electronic component) on the board 6 (ST14: component mounting step). At this time, the component D is supplied from a tape feeder 8 different from the tape feeder 8 that supplies the chip solder CS. The "chip solder mounting step" (ST13) and the "component mounting step" (ST14) may be executed in a reverse order. That is, the chip solder CS may be mounted on the board 6 after the component D is mounted.

Next, the mounting control unit 41 controls the board transport unit 5 and transports the board 6 on which the chip solder CS and the component D are completely mounted outside of the component mounting apparatuses M3 and M4 on the downstream side or the component mounting line 1 (ST15). Next, the mounting control unit 41 determines that the predetermined number of boards 6 on which mounting is completed is produced (ST16) and, in a case where there is a board 6 to be produced as a component mounting target (No in ST16), the process returns to ST12 and the chip solder CS and the component D are mounted on the board 6 as the following component mounting operation target. The mounting control unit 41 ends the component mounting operation in a case where the component mounting on all the boards 6 has ended (Yes in ST16).

According to the present embodiment as described above, the mounting unit 12 mounts the chip solder CS supplied from the tape feeder 8 (component supply means) on the board 6 based on the production data 42a in which the size of the chip solder CS which is mounted on each land E (electrode) of the board 6 is instructed. Accordingly, in a case where the cream solder PS which is supplied on the land E by the solder printer M1 is insufficient for the ideal solder amount, it is possible to mount the chip solder CS having the appropriate size on the board 6.

As described above, an example is described, in which the production data 22d is generated in the administration computer 3, the production data 22d is transmitted to the component mounting apparatuses M2 to M4, and the production data 22d is stored as the production data 42a in the mounting storage unit 42; however, the generation and the storing method of the production data 42a are not limited to the example described above. That is, the production data 42a may be generated by the mounting control units 41 of the component mounting apparatuses M2 to M4 and may be stored in the mounting storage unit 42. In addition, the various types of data which is referred to when the production data 42a is generated are stored in the administration storage unit 22 of the administration computer 3; however, the various types of data may be stored in the mounting storage units 42 of the component mounting apparatuses M2 to M4.

In addition, as above, an example is described, in which the chip solder CS and the component D are supplied from different tape feeders 8 which are provided in the same component mounting apparatus M2 and are mounted on the board 6; however, the chip solder CS and the component D may be mounted on the board 6 by different component mounting apparatuses M2 to M4. For example, the chip solder CS may be supplied from the tape feeder 8 provided in the component mounting apparatus M2 and may be mounted on the board 6 and, since the board 6 is transported to the component mounting apparatus M3, the component D may be supplied from the tape feeder 8 provided in the component mounting apparatus M3 and may be mounted on the board 6.

A component mounting apparatus, a component mounting method, and a component mounting line of the present invention are effective in that it is possible to mount chip solder having an appropriate size on a board and are applicable in a component mounting field in which a component is mounted on a board.

What is claimed is:

1. A component mounting method comprising:
providing a component mounting line with a solder printer that prints on a board with cream solder through a mask;
providing the component mounting line with a component mounting apparatus, the component mounting apparatus including a mounting unit that mounts an electronic component on the board and a component supply unit that supplies the electronic component or a chip solder;
calculating a plurality of sizes of the chip solder, each size of the chip solder corresponding to a size of each electrode of the board to which the electronic component is mounted;
storing the calculated plurality of sizes of the chip solder as part of production data used to mount the electronic component and the chip solder on the board;
printing, by the solder printer, the cream solder on the board through the mask;
supplying, by the component supply unit, the chip solder with the calculated size, based on the production data of each electrode of the board;
mounting the chip solder supplied from the component supply unit, on the board, by the mounting unit, based on the production data;
supplying, by the component supply unit, the electronic component to be mounted on the board; and
mounting, by the mounting unit, the electronic component supplied from the component supply unit, on the board.

2. The component mounting method according to claim 1, further comprising:
determining and storing in the production data both an ideal solder amount with which the electronic component is mounted and a theoretical solder amount of the cream solder which is printed by the solder printer.

3. The component mounting method according to claim 2, wherein the size of the chip solder stored in the production data is calculated based on the ideal solder amount and the theoretical solder amount.

4. The component mounting method according to claim 3, wherein in the step of calculating the plurality of the sizes of the chip solder, the size of each chip solder is set to have as small a difference as possible between a solder amount of the chip solder which is added and the ideal solder amount.

5. The component mounting method according to claim 1, wherein said supplying of the chip solder includes supplying pieces of chip solder having different sizes from a plurality of component supply units.

6. The component mounting method according to claim 1, wherein the electronic component is supplied from another component supply unit which is different from the component supply unit that supplies the chip solder.

* * * * *